United States Patent [19]
Herklotz et al.

[11] Patent Number: 6,103,025
[45] Date of Patent: Aug. 15, 2000

[54] FINE WIRE OF GOLD ALLOY, METHOD FOR MANUFACTURE THEREOF AND USE THEREOF

[75] Inventors: Günther Herklotz, Bruchköbel; Jürgen Reuel, Gelnhausen; Lutz Schräpler, Alzenau; Christoph Simons, Biebergemünd, all of Germany

[73] Assignee: W. C. Heraeus GmbH & Co. KG, Hanau, Germany

[21] Appl. No.: 09/110,905

[22] Filed: Jul. 6, 1998

[30] Foreign Application Priority Data

Jul. 7, 1997 [DE] Germany .............................. 197 28 871
Aug. 6, 1997 [DE] Germany .............................. 197 33 954

[51] Int. Cl.$^7$ ................................................... C22C 5/00
[52] U.S. Cl. ........................... 148/430; 420/508; 420/509; 420/510
[58] Field of Search ..................... 148/430, 678; 420/508, 509, 510

[56] References Cited

U.S. PATENT DOCUMENTS

| | | | |
|---|---|---|---|
| 4,885,135 | 12/1989 | Hosoda et al. . | |
| 4,938,923 | 7/1990 | Kujiraoka et al. . | |
| 5,702,814 | 12/1997 | Hanada et al. ............................ | 428/364 |
| 5,989,364 | 11/1999 | Kitamura ................................. | 148/430 |

FOREIGN PATENT DOCUMENTS

| | | |
|---|---|---|
| 0 743 679 A2 | 11/1996 | European Pat. Off. . |
| 0 761 831 A1 | 3/1997 | European Pat. Off. . |
| 1 600 161 | 9/1970 | Germany . |
| 1 608 161 | 9/1970 | Germany . |
| 44 42 960C1 | 12/1995 | Germany . |
| 2-91944A | 3/1990 | Japan . |
| 5-179375A | 7/1993 | Japan . |
| 5-179376A | 7/1993 | Japan . |
| 6-112254A | 4/1994 | Japan . |
| 6-112256A | 4/1994 | Japan . |
| 7-335685 | 12/1995 | Japan . |
| 8-293515A | 11/1996 | Japan . |

OTHER PUBLICATIONS

Chemical Abstracts, vol. 121, (1994) No. 89287 of JP 6–112258A.
Patent Abstracts of Japan, vol. 1997, No. 03, Mar. 31, 1997 & JP 08 293516 A (Nippon Steel Corp) , Nov. 5, 1996.
Patent Abstracts od Japan, vol. 1997, No. 03, Mar. 31, 1997 & JP 08 291348 A (Nippon Steel Copr) , Nov. 5, 1996.
Patent Abstracts of Japan, vol. 1997, vol. 1997, No. 03, March 31, 1997 & JP 08 293514 A (Nippon Steel Copr) , Nov. 5, 1996.

*Primary Examiner*—John Sheehan
*Attorney, Agent, or Firm*—Frishauf, Holtz, Goodman, Langer & Chick, P.C.

[57] ABSTRACT

Fine wires of a gold alloy of 0.05 to 0.95 wt % platinum, palladium or a mixture thereof; 0.001 to 0.1 wt % mischmetal containing at least 50 wt. % of cerium; and 0 to 0.1 wt % of alkaline earth metal. The wire has a favorable strength-to-elongation ratio and is suitable both for wire bonding and for making the ball bumps of flip chips.

17 Claims, 1 Drawing Sheet

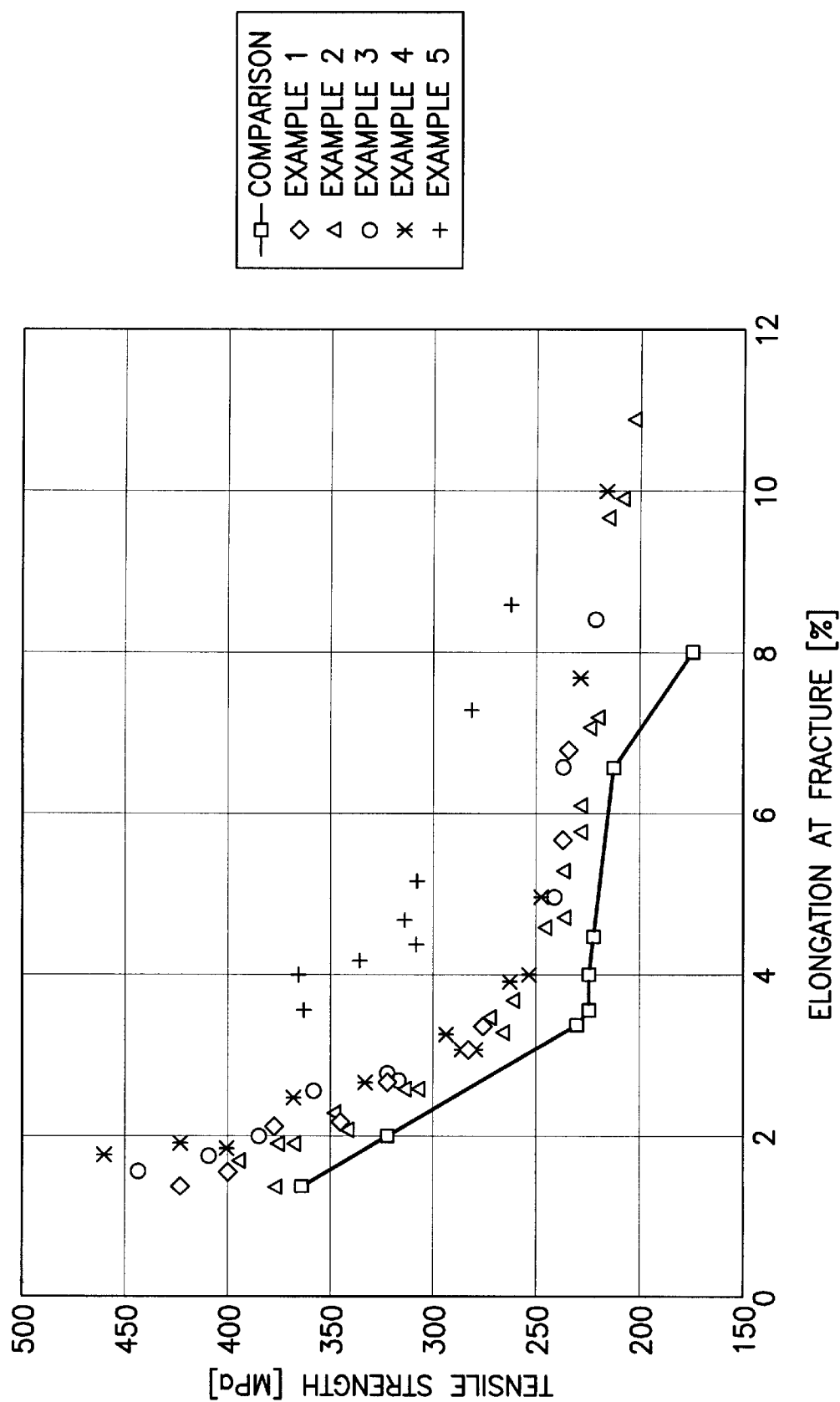

FINE WIRE OF GOLD ALLOY, METHOD FOR MANUFACTURE THEREOF AND USE THEREOF

BACKGROUND OF THE INVENTION

The invention relates to fine wire of a gold alloy containing mischmetal and platinum or palladium (or a mixture thereof) for bonding to semiconductor devices to form an electrical connection to the semiconductor, a method for manufacture thereof and the use thereof.

Wires suitable for bonding to semiconductor devices, also known as bonding wires, must have good electrical characteristics and good mechanical strength values. The diameter of the wires is selected to match the requirements of the application and can range from about 10 to 200 micrometers and is usually about 20 to 60 micrometers.

Bonding wires are often made of high-purity gold or of gold alloys containing rare earth metals.

For example, DE 16 08 161 C teaches that an alloy of gold and 0.001 to 0.1% of one or more rare earth metals, especially in the form of mischmetal or yttrium, can be used to make lead wires in integrated circuits. This gold alloy containing small quantities of rare earth metals or yttrium has much better strength and elongation behavior at heating temperatures up to 500° C. without experiencing substantial influence on other characteristics of the gold such as hardness, chemical stability or electrical resistance.

Gold-rare earth metal alloys for bonding wires are also described in DE 32 37 385 A (U.S. Pat. No. 4,885,135), DE 39 36 281 A (U.S. Pat. No. 4,938,923), JP 5-179375 A, JP 5-179376 A, JP 6-112258 A, EP 0 743 679 A and EP 0 761 831 A.

DE 32 37 385 A relates to a gold-alloy fine wire with high tensile strength comprising a gold alloy containing 0.0003 to 0.01 wt % of rare earth metal, especially cerium, and also germanium, beryllium and/or calcium as appropriate.

DE 39 36 281 A describes a gold wire, for connecting a semiconductor device, of high-purity gold alloyed with small quantities of lanthanum, beryllium, calcium and platinum group elements, especially platinum and/or palladium.

JP 5-179375 A and JP 5-179376 A relate to gold-alloy fine wires for bonding which comprise high-purity gold and 0.0003 to 0.005 wt % of aluminum or gallium, 0.0003 to 0.003 wt % of calcium and 0.0003 to 0.003 wt % of yttrium, lanthanum, cerium, neodymium, dysprosium and/or beryllium.

The bonding wire known from JP 6-112258 A, cited in Chemical Abstracts Vol. 121, 89287m, comprises a gold alloy containing 1 to 30% of platinum and 0.0001 to 0.05% of scandium, yttrium and/or rare earth metal and also 0.0001 to 0.05% of beryllium, calcium, germanium, nickel, iron, cobalt and/or silver as appropriate.

A bonding wire of a platinum-containing gold-rare earth metal alloy is also proposed in EP 0 743 679 A. The alloy comprises gold and small quantities of platinum (0.0001 to 0.005 wt %), silver, magnesium and europium, and can also contain, for example, cerium in a quantity of 0.0001 to 0.02 wt %.

A fine wire of a gold-rare earth metal alloy containing platinum and/or palladium is described in EP 0 761 831 A. The alloy comprises 0.1 to 2.2 wt % of platinum and/or palladium, 0.0001 to 0.005 wt % of beryllium, germanium, calcium, lanthanum, yttrium and/or europium, the remainder being gold. The wire is made by melting the alloy-forming elements in a crucible, progressively cooling the molten alloy contained in the crucible from bottom to top to obtain a casting (ingot), and thereafter rolling, drawing and annealing. It has an elongation of 3 to 8% and a Young's modulus of 6800 to 9000 kgf/mm$^2$.

A bonding wire of gold, 0.1 to 0.8 wt % of platinum and 0.0003 to 0.01 wt % of calcium, beryllium, germanium, rare earth metal, strontium, barium, indium, tin and/or titanium is known from JP 7-335685 A (Patent Abstracts of Japan).

JP 8-293515 A (Patent Abstracts of Japan) also relates to bonding wires of gold-platinum alloys. The gold alloys contain in addition to gold 0.04 to 1.5 wt % of platinum, 0.004 to 0.06 wt % of yttrium, calcium, lanthanum and/or cerium and also 0.0005 to 0.05 wt % of aluminum and/or indium as appropriate.

JP 6-112254 A (Patent Abstracts of Japan) specifies the manufacture of a bonding wire of a mixture of gold, 0.1 to 1 wt % of platinum and 0.0001 to 0.005 wt % of iron, silicon, beryllium, calcium, germanium, yttrium, scandium and/or rare earth metals. The mixture is melted and cast. This is followed by rolling to shape, annealing and wire drawing to obtain a wire with a diameter of 25 micrometers. The strength of the bonding wire is increased by the addition of platinum, whereby failures in a high temperature test become less frequent.

JP 6-112256 A (Patent Abstracts of Japan) specifies the manufacture of a bonding wire of a mixture of gold, 0.003 to 0.1 wt % of palladium, platinum, rhodium, iridium, osmium and/or ruthenium and 0.0001 to 0.05 wt % of scandium, yttrium and/or rare earth metals. The mixture is melted and cast. This is followed by rolling to shape, annealing and wire drawing to obtain a wire with a diameter of 25 micrometers. The strength of the bonding wire is increased by the addition of the platinum group metals, whereby failures in a high temperature test become less frequent.

JP 2-91944 A (Patent Abstracts of Japan) relates to a gold fine wire suitable for gold bumps comprising a gold alloy, which in addition to gold contains 0.5 to 10 wt % of palladium and 0.0001 to 0.02 wt % of lanthanum, cerium and/or calcium.

DE 44 42 960 C relates to bumps for mounting flip chips and methods for making the same. The bump cores can be made mechanically as ball bumps using a wire material of 98% gold and 2% palladium.

The requirements for selecting bonding wires include not only special chemical and physical properties but also, in particular, the highest possible strength for given elongation.

Proceeding from DE 16 08 161 C, the object of the invention is therefore to provide fine wire of the type characterized in the introduction, comprising a gold alloy containing mischmetal and having the best possible strength-to-elongation ratio. Another object is to provide a cost-effective, continuous method for making the fine wire. The fine wire is intended to be suitable both for wire bonding and also for making ball bumps for flip-chip technology, as is described, for example, in DE 44 42 960 C.

BRIEF SUMMARY OF THE INVENTION

The fine wire attaining the objects of the present invention is characterized according to the invention by the fact that the gold alloy comprises 0.05 to 0.95 wt % of platinum, 0.001 to 0.1 wt % of mischmetal, 0 to 0.1 wt % of alkaline earth metal, the remainder being gold. The preferable mischmetal for the present invention comprises at least 50 wt % of cerium. The diameter can normally range from about 10 to 200 micrometers and usually about 20 to 60 micrometers. The platinum can be wholly or partially replaced with palladium.

BRIEF DESCRIPTION OF THE DRAWING

The FIGURE shows the strength (tensile strength) [MPa] of some fine wires according to the invention and the prior art as a function of elongation (elongation at fracture) [%].

DETAILED DESCRIPTION OF THE INVENTION

The present invention is fine gold wire containing platinum, mischmetal (cer-mischmetal) and optionally, alkaline earth metal. Mischmetal is a commercially available product of variable composition. The mischmetal required by the present invention has at least about 50% cerium content.

Typical mischmetal compositions are: according to Römpp Chemie Lexikon [Römpp's Chemical Encyclopedia], Georg Thieme Verlag, Stuttgart, New York, 9th edition, 1989, 625, mischmetal is a mixture which can contain 45 to 60% of cerium, 15 to 30% of lanthanum, 10 to 20% of neodymium, 4 to 6% of praseodymium and 1 to 2% of samarium, plus 0.5 to 1% of yttrium and frequently also 0.5 to 1% of iron and silicon, carbon, phosphorus, manganese, magnesium and calcium, and according to Römpp Chemie Lexikon, 10th edition, 1996, 647, the mixture can contain 50 to 60% of cerium, 25 to 30% of lanthanum, 10 to 15% of neodymium, 4 to 6% of praseodymium and 1% of iron plus low proportions of other rare earth metals.

The fine gold alloy wire of the present invention is characterized according to the invention by the fact that the gold alloy comprises a total of 0.05 to 0.95 wt % of platinum or palladium or a mixture thereof, 0.001 to 0.1 wt % of mischmetal (containing at least 50 wt. % of cerium), 0 to 0.1 wt % of alkaline earth metal and the remainder being gold.

The fine wire has proved particularly useful when the platinum or palladium (or mixture thereof) content of the gold alloy is 0.25 to 0.9 wt %. In a favorable embodiment the mischmetal content is 0.001 to 0.01 wt % and the alkaline earth metal content is 0.0001 to 0.01 wt %.

The fine wire according to the invention with a diameter which is usual for bonding wires has all the characteristics necessary for bonding use. It is characterized in particular by its very good strength-to-elongation ratio. Surprisingly, the requirements of the invention of type and quantity of alloy-forming constituents, that is, mischmetal, platinum and also alkaline earth metal as appropriate, leads to the very favorable strength-to-elongation ratio of the fine wire that contributes substantially to the very good quality of the bonded connections, as compared with the art.

Referring to the single FIGURE, the strength (tensile strength) [MPa] as a function of elongation (elongation at fracture) [%] of fine wires according to the invention (Example 1 to 5) are compared with fine wire according to the prior art known from DE 16 08 161 C (Example 6): (see description of Examples below).

As can be seen from a comparison of the results, the fine wires according to the invention have higher strength for given elongation.

By virtue of its favorable characteristics, the fine wire according to the invention can be used with particular advantage for wire bonding, including the high-frequency bonding technique being developed, and for making the ball bumps for flip chips (e.g. see DE 44 42 960C discussed above).

The achievement of the objects of the invention further comprises a method for making a fine wire for bonding semiconductor devices comprising a gold alloy containing mischmetal, which is characterized according to the invention by the steps of melting a gold alloy of 0.05 to 0.95 wt % of platinum or palladium or a mixture thereof, 0.001 to 0.1 wt % of mischmetal (comprising at least 50 wt. % cerium), 0 to 0.1 wt % of alkaline earth metal, the remainder being gold, whereafter the melted alloy is continuously cast into a strand, the strand is drawn to a wire of standard diameter for bonding purposes, and the wire is annealed.

The method according to the invention has proved particularly useful when the molten alloy is continuously cast as a strand of circular cross section and the wire is annealed at about 300 to 700° C. The annealing step is accomplished according to usual procedures, under conditions which can be determined by preliminary tests, to impart the necessary elongation to the wire, which initially is poorly ductile. Melting and continuous casting of the alloy can be performed in air, under shielding gas such as argon, or in vacuum. Diameters of 10 to 200 micrometers, preferably 20 to 60 micrometers are usual for the finished wire.

The gold alloy used to form the wire preferably has a platinum content of 0.25 to 0.9 wt %; a mischmetal content of 0.001 to 0.01 wt % and an alkaline earth metal content of 0.0001 to 0.01 wt %.

As alkaline earth metal there can be used beryllium, magnesium, calcium, strontium, barium or a mixture of at least two of these elements. A mixture of beryllium and calcium has proved particularly useful, a mixture comprising about 50 wt % of beryllium and about 50 wt % of calcium being preferred.

It can also be advantageous if the alloy used has part or all of the platinum replaced by palladium. Therefore, the present invention is characterized by a gold alloy wire wherein palladium is used in place of platinum or in any mixture therewith.

The method according to the invention is characterized in particular by the fact that it can be operated continuously and yields process products such as cast strand and drawn wire with extremely uniform and constant quality.

The invention will be described in more detail hereinafter by examples of fine wires and manufacture thereof according to the invention (Examples 1 to 5) and, for comparison, a fine wire according to the prior art known from DE 16 08 161 C (Example 6). The fine wires are characterized by their elongation (elongation after fracture) [%] and strength (tensile strength) [MPa].

The mischmetal used in the examples is a commercial product with a cerium content of 53.6 wt %.

EXAMPLE 1

Fine wire of a gold alloy with 0.25 wt % of platinum and 0.003 wt % of mischmetal The melt of an alloy of 0.25 wt % of platinum, 0.003 wt % of mischmetal and gold as the remainder is cast in a continuous-casting system to a strand of circular cross section. A wire with a diameter of 30 micrometers is then drawn from the strand and the wire is annealed at about 300 to 600° C. in air depending on the elongation to be achieved. The strength values [MPa] measured as a function of elongation [%] are listed in Table I.

The specific electrical resistance at room temperature, measured on a wire with a diameter of 275 micrometers, is 0.026 ohm mm$^2$/m.

(In the following Tables, "*" indicates cold-drawn)

TABLE I

| Elongation [%] | Strength [MPa] |
| --- | --- |
| 1.4* | 423* |
| 1.6 | 400 |
| 2.1 | 379 |
| 2.2 | 346 |
| 2.7 | 318 |
| 3.4 | 276 |
| 5.7 | 237 |
| 6.8 | 234 |
| 8.4 | 221 |

EXAMPLE 2

Fine wire of a gold alloy with 0.5 wt % of platinum and 0.003 wt % of mischmetal The melt of an alloy of 0.5 wt % of platinum, 0.003 wt % of mischmetal and gold as the remainder is cast in a continuous-casting system to a strand of circular cross section. A wire with a diameter of 30 micrometers is then drawn from the strand and the wire is annealed at about 300 to 600° C. in air depending on the elongation to be achieved. The strength values [MPa] measured as a function of elongation [%] are listed in Table II.

The specific electrical resistance at room temperature, measured on a wire with a diameter of 275 micrometers, is 0.028 ohm mm$^2$/m.

TABLE II

| Elongation [%] | Strength [MPa] |
| --- | --- |
| 1.4* | 426* |
| 1.4 | 378 |
| 1.7 | 395 |
| 1.9 | 369 |
| 1.9 | 376 |
| 2.1 | 343 |
| 2.3 | 348 |
| 2.6 | 307 |
| 2.6 | 314 |
| 3.3 | 266 |
| 3.5 | 272 |
| 3.7 | 260 |
| 4.6 | 245 |
| 4.7 | 236 |
| 5.3 | 236 |
| 5.8 | 228 |
| 6.1 | 228 |
| 7.1 | 224 |
| 7.2 | 219 |
| 9.7 | 215 |
| 9.9 | 208 |
| 10.9 | 204 |

EXAMPLE 3

Fine wire of a gold alloy with 0.75 wt % of platinum and 0.003 wt % of mischmetal.

The melt of an alloy of 0.75 wt % of platinum, 0.003 wt % of mischmetal and gold as the remainder is cast in a continuous-casting system to a strand of circular cross section. A wire with a diameter of 30 micrometers is then drawn from the strand and annealed at about 300 to 600° C. in air depending on the elongation to be achieved. The strength values [MPa] measured as a function of elongation [%] are listed in Table III.

The specific electrical resistance at room temperature, measured on a wire with a diameter of 275 micrometers, is 0.031 ohm mm$^2$/m.

TABLE III

| Elongation [%] | Strength [MPa] |
| --- | --- |
| 1.6* | 444* |
| 1.8 | 410 |
| 2.0 | 386 |
| 2.6 | 359 |
| 2.7 | 322 |
| 2.8 | 322 |
| 4.0 | 252 |
| 4.6 | 248 |
| 5.0 | 241 |
| 6.6 | 236 |
| 8.4 | 221 |

EXAMPLE 4

Fine wire of a gold alloy with 0.9 wt % of platinum and 0.003 wt % of mischmetal.

The melt of an alloy of 0.9 wt % of platinum, 0.003 wt % of mischmetal and gold as the remainder is cast in a continuous-casting system to a strand of circular cross section. A wire with a diameter of 25 micrometers and a wire with a diameter of 30 micrometers are then drawn from the strand and each wire is annealed at about 300 to 600° C. in air depending on the elongation to be achieved. The strength values [MPa] measured as a function of elongation [%] are listed in Table IV.

The specific electrical resistance at room temperature, measured on a wire with a diameter of 275 micrometers, is 0.032 ohm mm$^2$/m.

TABLE IV

| Elongation [%] | Strength [MPa] |
| --- | --- |
| 1.8* | 460* |
| 1.9 | 424 |
| 1.9 | 402 |
| 2.5 | 369 |
| 2.7 | 334 |
| 3.1 | 280 |
| 3.1 | 286 |
| 3.3 | 293 |
| 3.9 | 262 |
| 4.0 | 253 |
| 5.0 | 246 |
| 7.7 | 228 |
| 10.0 | 215 |

EXAMPLE 5

Fine wire of a gold alloy with 0.9 wt % of platinum, 0.003 wt % of mischmetal, 0.001 wt % of beryllium, 0.001 wt % of calcium.

The melt of an alloy of 0.9 wt % of platinum, 0.003 wt % of mischmetal, 0.001 wt % of beryllium, 0.001 wt % of calcium and gold as the remainder is cast in a continuous-casting system to a strand of circular cross section. A wire with a diameter of 30 micrometers is then drawn from the strand and annealed at about 300 to 600° C. in air depending on the elongation to be achieved. The strength values [MPa] measured as a function of elongation [%] are listed in Table V.

TABLE V

| Elongation [%] | Strength [MPa] |
| --- | --- |
| 3.6 | 364 |
| 4.0 | 366 |
| 4.2 | 336 |
| 4.4 | 308 |
| 4.7 | 314 |
| 5.2 | 308 |
| 7.3 | 281 |
| 8.6 | 262 |

EXAMPLE 6

Comparison

Fine wire of a gold alloy with mischmetal according to DE 08 161 C.

The melt of an alloy of gold and mischmetal is cast in a continuous-casting system to a strand of circular cross section. A wire with a diameter of 25 micrometers and a wire with a diameter of 30 micrometers are then drawn from the strand and each wire is annealed at about 300 to 600° C. in air depending on the elongation to be achieved. The strength values [MPa] measured as a function of elongation [%] are listed in Table VI.

The specific electrical resistance at room temperature, measured on a wire with a diameter of 275 micrometers, is 0.024 ohm mm$^2$/m.

TABLE VI

| Elongation [%] | Strength [MPa] |
| --- | --- |
| 1.4* | 365 |
| 2.0 | 326 |
| 3.4 | 230 |
| 3.6 | 224 |
| 4.0 | 224 |
| 4.5 | 222 |
| 6.6 | 212 |
| 8.0 | 175 |

*cold-drawn

The above is illustrative but not limitative of the invention as additional modifications and equivalents would be known to persons of ordinary skill in this art.

What is claimed is:

1. A fine wire of a gold alloy containing mischmetal, for bonding semiconductor devices, wherein the gold alloy comprises a total of 0.05 to 0.95 wt % of platinum or palladium or a mixture thereof; 0.001 to 0.1 wt % of mischmetal containing at least 50 wt. % of cerium; 0 to 0.1 wt % of alkaline earth metal; and the remainder being gold.

2. A fine wire according to claim 1, wherein the total platinum or palladium or mixture thereof content of the gold alloy is 0.25 to 0.9 wt %.

3. A fine wire according to claim 1, wherein the mischmetal content of the gold alloy is 0.001 to 0.01 wt %.

4. A fine wire according to claim 1, wherein the alkaline earth metal content of the gold alloy is 0.0001 to 0.01 wt %.

5. A fine wire according to claim 1, wherein the gold alloy contains platinum.

6. A fine wire according to claim 1, wherein the gold alloy contains palladium.

7. A fine wire according to claim 1, wherein the platinum or palladium, or mixture thereof content of the gold alloy is 0.25 to 0.9 wt %;

the mischmetal content of the gold alloy is 0.001 to 0.01 wt %; and the alkaline earth metal content of the gold alloy is 0.0001 to 0.01 wt %.

8. A fine wire of a gold alloy containing mischmetal, for bonding semiconductor devices, wherein the gold alloy comprises a total of 0.05 to 0.95 wt % of platinum or palladium or a mixture thereof; 0.001 to 0.1 wt % of mischmetal containing at least 50 wt. % of cerium; 0 to 0.1 wt % of alkaline earth metal; and the remainder being gold, and wherein the alkaline earth metal is a mixture of beryllium and calcium.

9. A method for making a fine wire from a gold alloy containing mischmetal for bonding to a semiconductor comprising melting a gold alloy of 0.05 to 0.95 wt % of platinum or palladium or a mixture thereof, 0.001 to 0.1 wt % of mischmetal containing at least 50 wt. % cerium, 0 to 0.1 wt % of alkaline earth metal and the remainder being gold, continuously casting the melted alloy into a strand, drawing the strand to a wire for bonding to a semiconductor, and annealing the wire.

10. A method according to claim 9, wherein the melted alloy is continuously cast as a strand of circular cross section.

11. A method according to claim 9, wherein the gold alloy having a platinum or palladium or mixture thereof content of 0.25 to 0.9 wt % is melted.

12. A method according claim 9, wherein the gold alloy having a mischmetal content of 0.001 to 0.01 wt % is melted.

13. A method according to claim 9, wherein the gold alloy having an alkaline earth metal content of 0.0001 to 0.01 wt % is melted.

14. A method according to claim 9, wherein the gold alloy containing a mixture of beryllium and calcium as alkaline earth metal is melted.

15. A method according to claim 9, wherein the gold alloy containing platinum is melted.

16. A method according to claim 9, wherein the gold alloy containing palladium is melted.

17. A method according to claim 9, wherein the annealing step comprises annealing the wire at 300 to 700° C.

* * * * *